United States Patent
Butler et al.

(10) Patent No.: US 8,730,451 B2
(45) Date of Patent: May 20, 2014

(54) LITHOGRAPHIC APPARATUS FOR TRANSFERRING PATTERN FROM PATTERNING DEVICE ONTO SUBSTRATE, AND DAMPING METHOD

(75) Inventors: Hans Butler, Best (NL); Marco Hendrikus Hermanus Oude Nijhuis, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 326 days.

(21) Appl. No.: 13/281,214

(22) Filed: Oct. 25, 2011

(65) Prior Publication Data

US 2012/0105819 A1 May 3, 2012

Related U.S. Application Data

(60) Provisional application No. 61/407,319, filed on Oct. 27, 2010.

(51) Int. Cl.
*G03B 27/42* (2006.01)
*G03B 27/54* (2006.01)
*G03F 7/20* (2006.01)

(52) U.S. Cl.
CPC ..................................... *G03F 7/709* (2013.01)
USPC ............................................. 355/53; 355/67

(58) Field of Classification Search
CPC .... G03F 7/70883; G03F 7/709; G03F 7/7085
USPC ...................... 355/53, 67; 118/378
See application file for complete search history.

(56) References Cited

U.S. PATENT DOCUMENTS

| | | | |
|---|---|---|---|
| 6,378,672 B1 | 4/2002 | Wakui | |
| 7,110,083 B2 | 9/2006 | Loopstra et al. | |
| 7,817,243 B2 * | 10/2010 | Heertjes et al. | 355/53 |
| 8,059,259 B2 | 11/2011 | Butler et al. | |
| 8,164,737 B2 | 4/2012 | Butler et al. | |

(Continued)

FOREIGN PATENT DOCUMENTS

| | | |
|---|---|---|
| CN | 101446771 | 6/2009 |
| CN | 101452222 | 6/2009 |

(Continued)

OTHER PUBLICATIONS

Japanese Office Action mailed Dec. 27, 2012 in corresponding Japanese Patent Application No. 2011-230460.

(Continued)

*Primary Examiner* — Hung Henry Nguyen
(74) *Attorney, Agent, or Firm* — Pillsbury Winthrop Shaw Pittman LLP

(57) ABSTRACT

A lithographic apparatus includes a support frame which is supported by a base via a vibration isolation system; a projection system arranged to transfer a pattern from a patterning device onto a substrate, wherein the projection system includes a first frame which is spring-supported by the support frame; and an active damping system configured to damp movement of the first frame, including: a first sensor system configured to provide a first sensor output representative of absolute movement of the first frame, a first actuator system arranged to apply a force between the first frame and the support frame, and a control system configured to provide a drive signal to the first actuator system based on the first sensor output.

17 Claims, 3 Drawing Sheets

(56) References Cited

U.S. PATENT DOCUMENTS

| | | |
|---|---|---|
| 8,203,694 B2 | 6/2012 | Van Der Wijst et al. |
| 8,245,824 B2 * | 8/2012 | Butler et al. .......... 188/378 |
| 8,300,208 B2 | 10/2012 | Loopstra et al. |
| 8,553,199 B2 | 10/2013 | Butler et al. |
| 2005/0105069 A1 | 5/2005 | Loopstra et al. |
| 2009/0091725 A1 | 4/2009 | Van Der Wijst et al. |
| 2009/0122284 A1 | 5/2009 | Butler et al. |
| 2009/0147230 A1 | 6/2009 | Butler et al. |
| 2009/0207393 A1 | 8/2009 | Butler et al. |
| 2009/0237793 A1 | 9/2009 | Koo et al. |
| 2010/0149516 A1 | 6/2010 | Loopstra et al. |

FOREIGN PATENT DOCUMENTS

| | | |
|---|---|---|
| DE | 296 12 349 | 11/1997 |
| EP | 2 128 700 | 12/2009 |
| JP | 2004513503 | 5/2007 |
| JP | 2007-522393 | 8/2007 |
| JP | 2007-247822 | 9/2007 |
| JP | 2007-285430 | 11/2007 |
| JP | 2009-507359 | 2/2009 |
| JP | 2010-141321 | 6/2010 |
| TW | I298427 | 7/2008 |
| TW | 201030254 | 8/2010 |
| WO | 2005/073592 | 8/2005 |

OTHER PUBLICATIONS

Singapore Search Report and Written Opinion dated Dec. 27, 2012 in corresponding Singapore Patent Application No. 201107312-9.

Korean Office Action mailed Apr. 29, 2013 in corresponding Korean Patent Application No. 10-2011-0109118.

* cited by examiner

LITHOGRAPHIC APPARATUS FOR TRANSFERRING PATTERN FROM PATTERNING DEVICE ONTO SUBSTRATE, AND DAMPING METHOD

CROSS REFERENCE TO RELATED APPLICATIONS

This application claims priority and benefit under 35 U.S.C. §119(e) to U.S. Provisional Patent Application No. 61/407,319, entitled "Apparatus For Transferring Pattern From Patterning Device Onto Substrate, and Damping Method", filed on Oct. 27, 2010. The content of that application is incorporated herein in its entirety by reference.

FIELD

The present invention relates to a lithographic apparatus for transferring a pattern from a patterning device onto a substrate, and a method for damping a first frame of such an apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatus commonly comprise a support frame which is supported by a base via a vibration isolation system, and a projection system arranged to transfer a pattern from a patterning device onto a target portion of a substrate, wherein the projection system comprises a first frame which is spring-supported by the support frame. Spring-supported in this context refers to a resilient support which may alternatively be referred to as spring-mounted, and does not require the actual presence of a spring. Any element having a resilient or spring-like behavior, such as air-mounts may form a spring-support as mentioned in this application.

The mentioned vibration isolation system is used to isolate the support frame from vibrations in the base and may therefore use elements having a resilient or spring-like behavior. Therefore, a mass can be spring-supported by another mass using a vibration isolation system that is arranged in between the two masses, or in other words, the vibration isolation system may form a spring-support. Vibration isolation systems and spring-support are well known to a person skilled in the art and will therefore not be described in more detail.

The first frame may interact with other parts of the projection system such as optical elements, e.g. lens element, mirrors, etc. As the optical elements of the projection system are critical in the imaging performance of the lithographic apparatus, it is desired that the interaction between the first frame and the optical elements minimally disturbs the optical elements. However, it has been found that first frame movements cause disturbances of the optical elements. These movements may originate from movement of the support frame, which in turn may be caused by movement of other masses supported by the support frame, so that movement of e.g. a second frame of the projection system excites movement of the first frame. This effect may be worsened by the fact that resonance frequencies of the first frame can be close to other resonance frequencies of masses connected to the first frame via the support frame. As a result, the imaging performance of the lithographic apparatus is not satisfactory.

Additionally, movement of the first frame may induce deformations of the frame. As the first frame is commonly used to support sensors measuring the optical element positions, these frame deformations may induce position errors in the optical element, again leading to a deteriorated imaging performance of the lithographic apparatus.

SUMMARY

It is desirable to provide an improved lithographic apparatus, in particular an apparatus having an improved imaging performance.

According to an embodiment of the invention, there is provided a lithographic apparatus comprising: a support frame supported by a base via a vibration isolation system; a projection system arranged to transfer a pattern from a patterning device onto a substrate, wherein the projection system comprises a first frame which is spring-supported by the support frame; and an active damping system configured to damp movement of the first frame, the active damping system comprising: a first sensor system configured to provide a first sensor output representative of absolute movement of the first frame, a first actuator system arranged to apply a force between the first frame and the support frame, and a controller configured to provide a drive signal to the first actuator based on the first sensor output.

According to another embodiment of the invention, there is provided a method for damping movement of a first frame of a lithographic apparatus, wherein the first frame is spring-supported by a support frame which in turn is supported by a base via a vibration isolation system, the method comprising: a) measuring the absolute movement of the first frame; b) applying a force between the first frame and the support frame based on the measured movement of the first frame.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
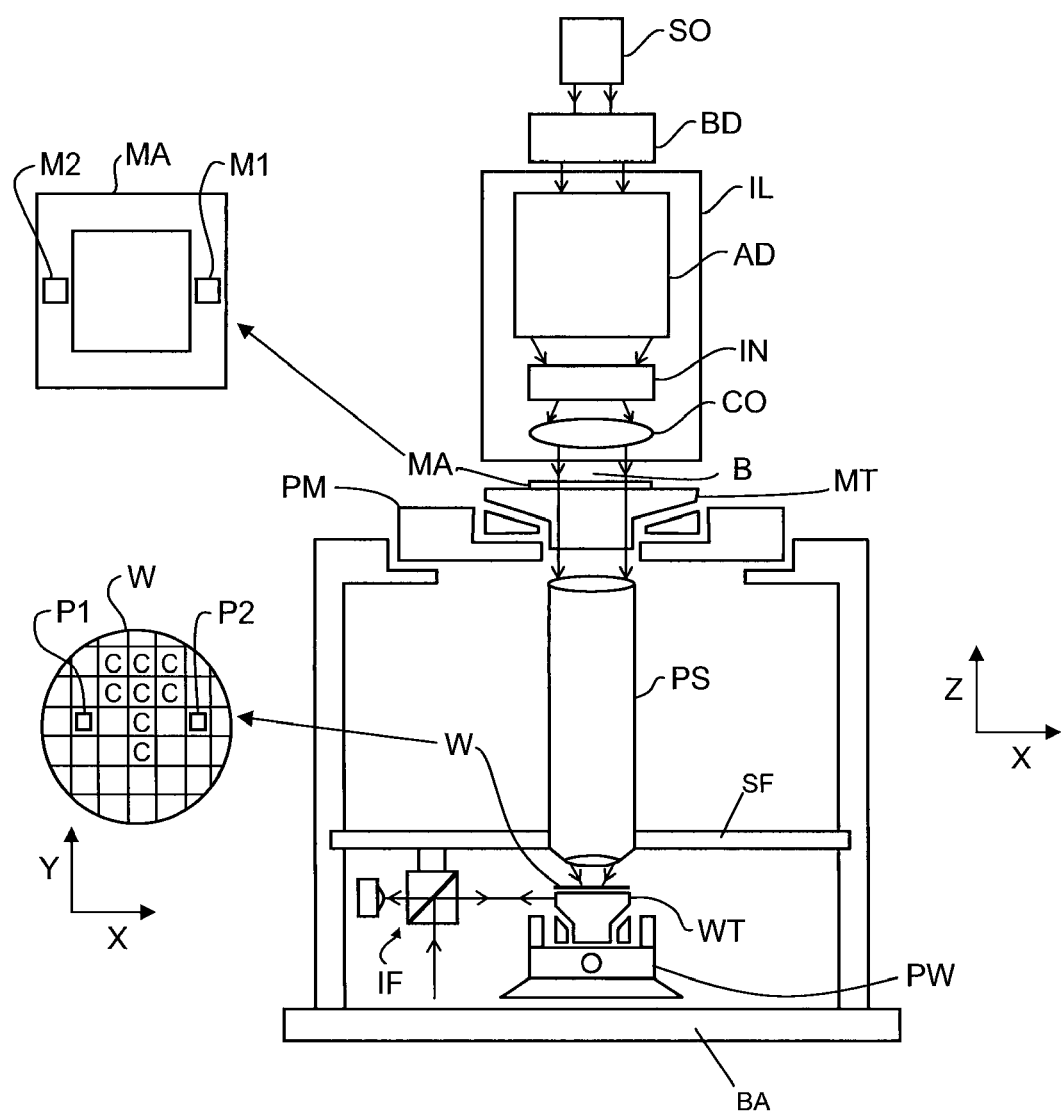
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PS is in the embodiment of FIG. 1 supported by a support frame SF, which in turn is supported by a base BA. A more detailed schematic view of the support configuration is shown with reference to FIG. 2.

Figure 2:
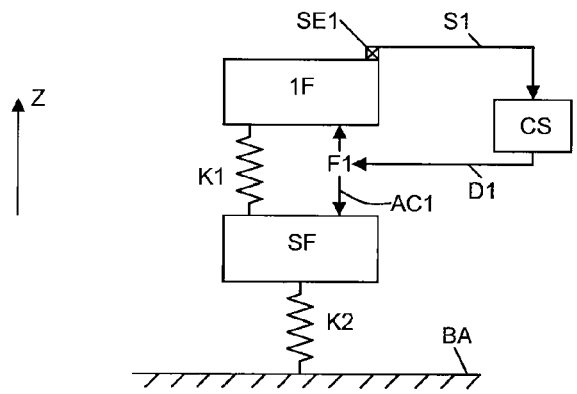
FIG. 2 depicts schematically a portion of the lithographic apparatus of FIG. 1 in accordance with an embodiment of the invention.

FIG. 2 depicts schematically a portion of the lithographic apparatus of FIG. 1 in more detail in accordance with an embodiment. Shown are a first frame 1F of the projection system, the support frame SF and the base BA. The base BA may be the ground, but may also be a base frame that is spring-supported by the ground, but which due to its relatively high mass and low-frequency support by the ground acts as ground for the parts of the lithographic apparatus supported by the base frame.

The support frame SF is spring-supported by the base BA, which may be alternatively referred to as resiliently mounted or spring-mounted to the base. In an embodiment, the support frame is low-frequency supported by the base via a vibration isolation system. The spring-support is schematically indicated through spring K2, but in practice can be any structural element having a resilient or spring-like behavior. The low-frequency behavior of the support frame relative to the base is the result of a small effective spring constant in combination with a relatively high mass of the support frame.

The first frame 1F of the projection system PS is spring-supported by the support frame SF, as schematically indicated by spring K1, and will in practice usually have a resonance frequency at least one order above the resonance frequency of the support frame.

FIG. 2 depicts the first frame and support frame in a one-dimensional situation in which the first frame and the support frame are only capable of moving in a Z-direction. It will be appreciated that the principles underlying the invention can also be applied or extended to multiple degree of freedom situations.

The projection system PS is a critical element of the lithographic apparatus and amongst other determines the imaging performance of the lithographic apparatus. It is desirable that the projection system be subjected to minimal disturbances. Due to the support structure as shown in FIG. 2, disturbances may enter the projection system via the support frame and/or the base, and may excite resonance modes. In an embodiment, the lithographic apparatus comprises an active damping system or damper to minimize the disturbances by damping the movement of the first frame.

The active damping system comprises a first sensor system configured to provide a first sensor output representative of absolute movement of the first frame, a first actuator system arranged to apply a force between the first frame and the support frame, and a control system or controller CS to provide a drive signal to the first actuator system based on the first sensor output.

In this embodiment, the first sensor system is formed by a first sensor SE1. This first sensor SE1 is able to detect movement of the first frame 1F in the Z-direction and provides a first sensor signal S1 that is representative of the movement. The first sensor signal S1 thus forms the first sensor output.

The first sensor output S1 is input to the control system CS which performs operations on the first sensor output S1 and outputs a drive signal D1 representative of a force that needs to be applied between the first frame and the support frame to dampen the movement.

The first actuator system is formed in this embodiment by a first actuator AC1 configured to apply a force F1 in dependency of a drive signal D1. The drive signal D1 is thus applied to the first actuator AC1 in order to close the feedback loop formed by the first sensor system, the control system and the first actuator system.

It is noted here that according to the invention, the movement of the first frame is measured absolutely, while the force generated by the first actuator system is applied relative to the support frame, which results in an improved damping performance.

A benefit of actively damping the first frame according to an embodiment of the invention is that the transmissibility for higher frequencies is better, i.e. high-frequency vibrations are more suppressed, compared to an active damping system in which the movement is measured relatively and the force is applied relatively (a commonly used damping system) as the vibrations of the support frame are blocked by a so-called −2 slope instead of a −1 slope.

Another benefit is that the low-frequency performance of the active damping system according to an embodiment of the invention has improved compared to an active damping system in which the movement is measured absolutely and the force is also applied absolutely (another commonly used damping system) as a low-frequency vibration of the support frame (occurring regularly) is not counteracted by applying large absolute forces on the first frame, which would need to pass through spring K1 to decrease the movement of the support frame.

An additional benefit may be that applying a force to the first frame 1F in an absolute manner, so between the first frame and the fixed world, which may be formed by the base or a separate, preferably free-moving reaction mass, may not be practical as the base may not be nearby. Further, a separate reaction mass may also not be practical as it usually needs to be relatively heavy and low-frequency coupled to the first frame which may in use result in large movements of the reaction mass thus requiring a lot of space. By applying the force in a relative manner, no structural connection to the base nor a reaction mass is required.

Figure 3:
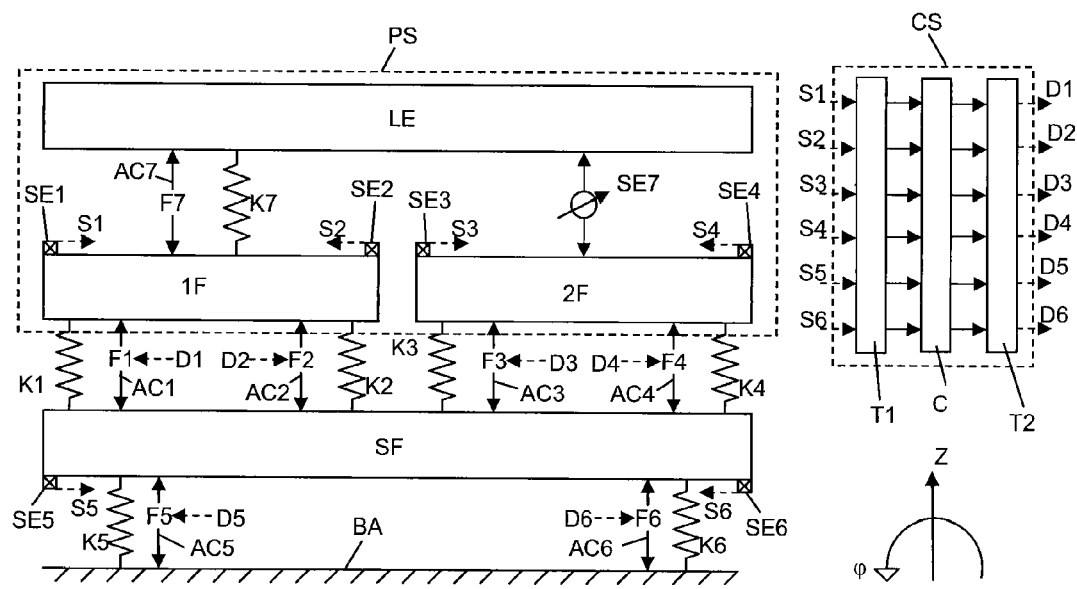
FIG. 3 depicts schematically a portion of a lithographic apparatus according to another embodiment of the invention.

FIG. 3 depicts a portion of an apparatus according to another embodiment of the invention, in which the apparatus is similar to the lithographic apparatus of FIG. 1.

FIG. 3 shows a projection system PS, which has an optical element, e.g. e lens element, LE. The projection system is arranged to transfer a patterning from a patterning device (not shown) onto a substrate (not shown). The optical element LE is spring-supported by a first frame 1F of the projection system PS, as schematically indicated by spring K7, and can be positioned in Z-direction by an actuator system, here embodied in the form of a seventh actuator AC7, which is configured to apply a force F7 between the first frame 1F and the optical element LE. The position of the optical element LE is detected by a sensor system, here embodied in the form of a seventh sensor SE7. The seventh sensor SE7 provides an output which is representative of the position of the optical element LE relative to a second frame 2F of the projection system PS. The first and second frame 1F, 2F are independently from each other spring-supported by a support frame SF as is indicated schematically by respective springs K1, K2, and K3, K4. The support frame SF in turn is spring-supported by a base BA as schematically indicated by springs K5,K6. Any of the schematic springs K1-K6 may be part of or form a vibration isolation system.

In the embodiment of FIG. 3, the first frame, the second frame, and the support frame have two degrees of freedom, namely a translation in Z-direction and a rotation in φ-direction. This is the reason why two springs are used per frame to indicate the spring-suspension. In practice, the resonance modes of the first and second frame may be relatively close to each other, so that movement of one of the frames, may easily excite the modes of the other frame via the support frame. In practice, each component in FIG. 3 may have six degrees of freedom. However, to better explain the embodiment of FIG. 3, the number of degrees of freedom is limited to two in this embodiment.

The apparatus comprises an active damping system configured to dampen movement of the first frame and in this embodiment also movement of the second frame. The active damping system comprises a first sensor system to measure absolute movement of the first frame. The first sensor system comprises two sensors SE1, SE2 each measuring movement of the first frame in Z-direction, thereby also obtaining information about the φ-direction. Each sensor SE1, SE2 outputs a sensor signal S1,S2 which together define a first sensor output of the first sensor system representative for movement of the first frame 1F.

The active damping system further comprises a second sensor system comprising two sensors SE3, SE4 similar to the first sensor system. Sensor signals S3,S4 respectively from sensor SE3, SE4 thus define a second sensor output representative for movement of the second frame 2F.

The active damping system also comprises a support frame sensor system comprising two sensors SE5,SE6 similar to the first sensor system. Sensor signals S5, S6 respectively from sensors SE5,SE6 thus define a support frame sensor output representative of movement of the support frame SF.

The active damping system comprises a first actuator system comprising two actuators AC1, AC2 which are able to apply a respective force F1, F2 between the first frame 1F and the support frame. This embodiment thus uses the same principle as the embodiment of FIG. 2 in which the movement is measured absolutely, and the damping forces are applied relatively.

The active damping system of FIG. 3 further comprises a second actuator system comprising two actuators AC3, AC4 which are able to apply a respective force F3, F4 between the second frame 2F and the support frame. This embodiment thus also applies the principle of FIG. 2 to the second frame of the projection system.

In addition to the first and the second actuator systems, the active damping system comprises a support frame actuator system comprising two actuators AC5, AC6 which are able to apply a respective force F5, F6 between the support frame and the base. As an alternative, the forces F5, F6 may be applied between the support frame and a separate reaction mass, for example a free-moving reaction mass.

The sensor signals S1-S6 are provided to a control system CS of the active damping system. For simplicity reasons, the schematic connections between the respective sensors and the control system are omitted. It will be understood that a sensor signal Sn is connected to the respective input Sn of the control system, where n=1, 2, . . . , 6. In this embodiment, the control system is configured to decouple the first sensor output, the second sensor output, and the support frame sensor output, i.e. the sensor signals S1-S6 into resonance modes of the first frame, the second frame and the support frame. The resonance modes referred to in this embodiment, are rigid body modes of the interacting system of frames. Decoupling is done by performing a transformation T1 on the sensor signals as is known to a person skilled in the art.

The output of the transformation T1 are six signals which represent the six resonance modes of the system. Transformation operator T1 is obtained by modal decoupling. Control operations are performed on the resonance modes by a controller C consisting of six individual controllers, each relating one output of T1 to one input of T2. Subsequently, the controlled resonance modes need to be transformed into drive signals representative for the individual forces F1-F6 of the actuators AC1-AC6 of the respective actuator systems. This transformation is done by a transformation operator T2, which again is obtained by modal decoupling. Output of the control system are six drive signals D1-D6. For simplicity reasons, the schematic connections of the drive signals to their respective actuator are omitted. By providing the drive signals D1-D6 to the actuators, the damping system is able to damp the movements of the first and second frame.

The same principle of modal control can also be applied as an extension to the embodiment of FIG. 2, wherein a support frame sensor system is provided to provide a support frame sensor output representative of the movement of the support frame SF, and wherein the control system CS is configured to decouple the first sensor output and the support frame sensor output into resonance modes of the first frame 1F and the support frame SF, and to provide a drive signal D1 to the first actuator system AC1 based on the decoupled modes of the first frame 1F and the support frame SF.

When using modal control in an embodiment like FIG. 2 as described in the above paragraph, it is also possible to change the first actuator system such that it provides a force between the support frame and the base or a reaction mass instead of between the first frame and the support frame.

Figure 4:
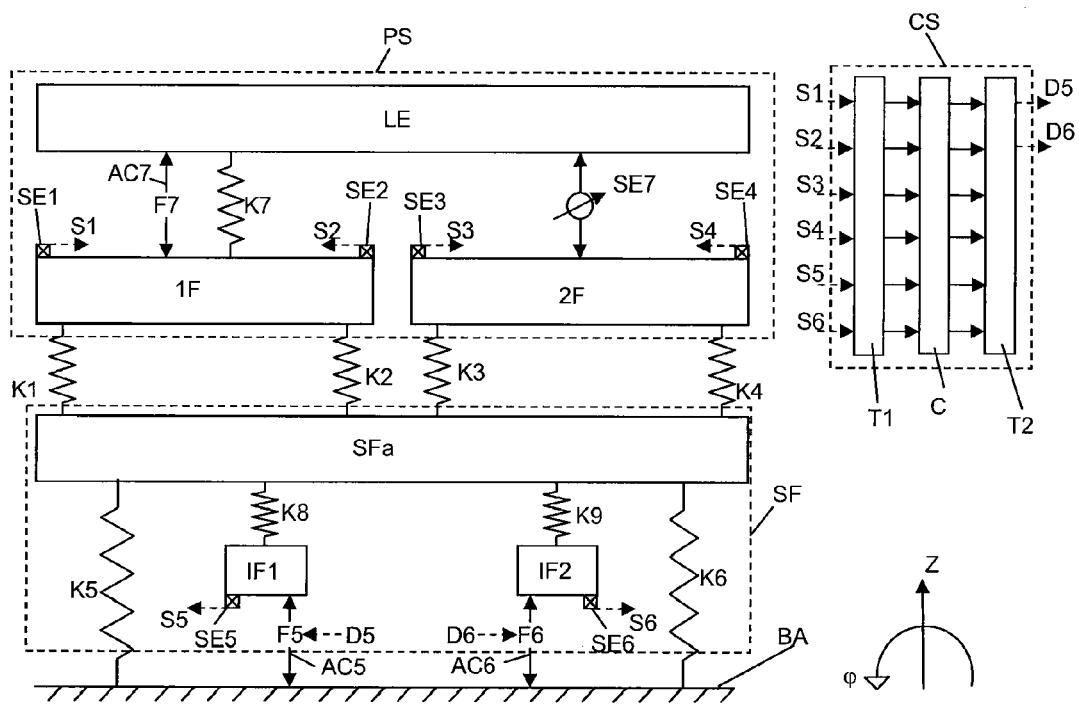
FIG. 4 depicts schematically a portion of a lithographic apparatus according to a further embodiment of the invention.

FIG. 4 depicts a portion of an apparatus according to another embodiment of the invention, wherein the apparatus is similar to the lithographic apparatus of FIG. 1. Schematically, the embodiment of FIG. 4 has a lot in common with the embodiment of FIG. 3. For a description of the projection system PS including first and second frame 1F, 2F, and the first and second sensor systems, reference is made to FIG. 3.

The support frame SF comprises two interface masses IF1, IF2, which are spring-mounted to the rest SFa of the support frame SF as schematically indicated by springs K8, K9. The portion SFa of the support frame SF is spring-supported by the base BA as indicated by springs K5, K6.

Provided is a support frame sensor system comprising two sensors SE5, SE6 which each provide a respective sensor signal S5, S6 representative of the absolute movement of the respective interface masses IF1,IF2. The interface masses including springs K8, K9 provide a dynamical filter in a mechanical way between the support frame sensor system and the rest of the support frame SFa. This has the benefit that vibrations, e.g. internal resonances, in the rest of the support frame SFa having a frequency above the cut-off frequency of the springs K8, K9 are attenuated and therefore have less influence on the active damping system.

Also provided is a support frame actuator system comprising two actuators AC5, AC6 which each provide a respective force F5, F6 between the interface masses IF1, IF2 and the base or a separate reaction mass. A benefit of this configuration is that disturbances in the forces F5, F6 having a frequency above the cut-off frequency of the springs K8, K9 are attenuated and therefore have less influence on the rest of the support frame SFa.

The stiffness of the springs K8, K9 and the masses of the interface masses IF1, IF2 can be chosen to set the cut-off frequency at a predetermined level. In an embodiment, the cut-off frequency is chosen such that the disturbances on the active damping system and/or disturbances transferred to the support frame are minimal. In an embodiment, the interface masses are high-frequency coupled to the rest of the support frame SFa, wherein high-frequency means a frequency above the to be damped resonance modes of the first frame, the second frame and the support frame, and below a frequency of resonance modes that are to be considered parasitic, i.e. that do not need to be damped but negatively influence the active damping system.

The control system of FIG. 4 is further similar to the control system CS of FIG. 3 except that the transformation T2 does not provide six drive signals for six different actuators, but only two drive signals D5, D6 which are respectively representative of the forces F5, F6 to be applied by the support frame actuator system. The transformation T1 and T2 can be defined as matrices which are obtained by modal decoupling principles. Transformation matrix T1 has a size of 6×6 elements, and transformation matrix T2 is in this case a matrix having a size of 2×6 elements. All six resonance modes of the three frames as calculated by full matrix T1, are damped by the controller C, however, making only use of actuators AC5 and AC6.

The embodiment of FIG. 4 does not allow full modal control as only two actuators are used to dampen six resonance modes. This means that cross terms from one modal input to another modal output are no longer zero and full decoupling is not possible. However, for active damping of the resonance modes, these cross terms are no problem, so that still sufficient damping may be achieved by the active damping system.

The principle of using interface masses to communicate with the support frame can be used in other situations, e.g. the embodiment of FIG. 3, as well to improve performance.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support frame supported by a base via a vibration isolation system;
   a projection system arranged to transfer a pattern from a patterning device onto a substrate, wherein said projection system comprises a first frame which is spring-supported by the support frame; and
   an active damping system configured to damp movement of the first frame, the active damping system comprising
   a first sensor system configured to provide a first sensor output representative of an absolute movement of the first frame,
   a first actuator system arranged to apply a force between the first frame and the support frame, and
   a controller configured to provide a drive signal to the first actuator system based on the first sensor output.

2. The lithographic apparatus according to claim 1, wherein the active damping system further comprises a support frame sensor system configured to provide a support frame sensor output representative of a movement of the support frame, and wherein the controller is configured to provide a drive signal to the first actuator system based on the first sensor output and the support frame sensor output.

3. The lithographic apparatus according to claim 2, wherein the controller is configured to decouple the first sensor output and the support frame sensor output into resonance modes of the first frame and the support frame, and to provide a drive signal to the first actuator system based on the decoupled modes of the first frame and the support frame.

4. The lithographic apparatus according to claim 2, wherein the first actuator system is configured to apply a force between the support frame and the base or a separate reaction mass.

5. The lithographic apparatus according to claim 2, wherein the active damping system further comprises a support frame actuator system arranged to apply a force between the support frame and the base or a separate reaction mass, and wherein said controller is configured to provide a drive signal to the support frame actuator system based on the first sensor output and the support frame sensor output.

6. The lithographic apparatus according to claim 1, comprising a second frame which is spring-supported by the support frame in parallel to the first frame, and wherein the active damping system further comprises:
   a second sensor system configured to provide a second sensor output representative of absolute movement of the second frame,
   a second actuator system arranged to apply a force between the second frame and the support frame, and
   wherein the controller is configured to provide a respective drive signal to the first and second actuator system based on the first sensor output and the second sensor output.

7. The lithographic apparatus according to claim 2, wherein the respective drive signals are based on the first sensor output, the second sensor output, and the support frame sensor output.

8. The lithographic apparatus according to claim 2, wherein the controller is configured to decouple the first sensor output, the second sensor output, and the support frame sensor output into resonance modes of the first frame, the second frame, and the support frame, and wherein the controller is configured to provide the respective drive signals to the first and second actuator system based on said decoupled modes.

9. The lithographic apparatus according to claim 4, comprising a second frame which is spring-supported by the support frame in parallel to the first frame, and wherein the active damping system further comprises a second sensor system configured to provide a second sensor output representative of absolute movement of the second frame, and wherein the controller is configured to provide a drive signal to the first actuator system based on the first sensor output and the second sensor output.

10. The lithographic apparatus according to claim 2, wherein the active damping system further comprises a support frame actuator system arranged to apply a force between the support frame and the base or a reaction mass, and wherein said controller is configured to provide a respective drive signal to the support frame actuator system, the first actuator system, and the second actuator system based on the first sensor output, the second sensor output, and the support frame sensor output.

11. The lithographic apparatus according to claim 5, wherein the support frame has an interface mass which is high-frequency coupled to the rest of the support frame, and wherein the support frame sensor output is representative of movement of the interface mass, and wherein the support frame actuator system is configured to apply a force between the interface mass and the base or a separate reaction mass.

12. The lithographic apparatus according to claim 4, wherein the support frame has an interface mass which is high-frequency coupled to the rest of the support frame, and wherein the support frame sensor output is representative of movement of the interface mass, and wherein the first actuator is configured to apply a force between the interface mass and the base or a separate reaction mass.

13. The lithographic apparatus according to claim 1, wherein the first sensor system comprises a plurality of sensors.

14. The lithographic apparatus according to claim 1, wherein the first actuator system comprises a plurality of actuators.

15. A method for damping movement of a first frame of a lithographic apparatus, wherein said first frame is spring-supported by a support frame which in turn is supported by a base via a vibration isolation system, said method comprising:
   a) measuring the absolute movement of the first frame;
   b) applying a force between the first frame and the support frame based on the measured movement of the first frame.

16. The method according to claim 15, comprising:
   measuring the movement of the support frame;
   decoupling the measured movements of the first frame and the support frame into resonance modes of the first frame and the support frame,
   wherein b) is replaced by applying a force between the first frame and the support frame based on the decoupled modes of the first frame and the support frame.

17. The method according to claim 15, wherein b) is replaced by applying a force between the support frame and the base or a separate reaction mass based on the decoupled modes of the first frame and the support frame.

* * * * *